US009710010B2

(12) United States Patent
Shen et al.

(10) Patent No.: US 9,710,010 B2
(45) Date of Patent: Jul. 18, 2017

(54) START-UP CIRCUIT FOR BANDGAP REFERENCE

(71) Applicant: SK Hynix Memory Solutions Inc., San Jose, CA (US)

(72) Inventors: Chun-Ju Shen, Sunnyvale, CA (US); Mao-Ter Chen, San Jose, CA (US); Jenn-Gang Chern, Redwood City, CA (US)

(73) Assignee: SK Hynix Memory Solutions Inc., San Jose, CA (US)

(*) Notice: Subject to any disclaimer, the term of this patent is extended or adjusted under 35 U.S.C. 154(b) by 0 days.

(21) Appl. No.: 15/207,231

(22) Filed: Jul. 11, 2016

(65) Prior Publication Data

US 2017/0012609 A1 Jan. 12, 2017

Related U.S. Application Data

(60) Provisional application No. 62/191,235, filed on Jul. 10, 2015.

(51) Int. Cl.
*H03L 7/00* (2006.01)
*G05F 3/26* (2006.01)

(52) U.S. Cl.
CPC .................................... *G05F 3/267* (2013.01)

(58) Field of Classification Search
CPC ....................................................... G05F 3/267
See application file for complete search history.

(56) References Cited

U.S. PATENT DOCUMENTS 7,768,343 B1 8/2010 Sinitsky
8,253,452 B2 * 8/2012 Kushnarenko ............ G05F 3/30 327/143

OTHER PUBLICATIONS

Song, B., et al., A precision curvature-compensated CMOS bandgap reference, IEEE Journal of Solid-State Circuits, Dec. 1983, pp. 634-643, vol. 18, No. 6.
Banba, H., et al., A CMOS bandgap reference circuit with sub-1-V operation, IEEE Journal of Solid-State Circuits, May 1999, pp. 670-674, vol. 34, No. 5.

* cited by examiner

*Primary Examiner* — Daniel Puentes
(74) *Attorney, Agent, or Firm* — IP & T Group LLP

(57) ABSTRACT

A start-up circuit for a bandgap reference circuit include an operational amplifier and a diode coupled to a second input terminal of the operational amplifier. The circuit includes a first current branch including a first transistor and a second transistor in series, for generating a first current in response to an output voltage at an output terminal of the operational amplifier and a second current branch including a third transistor and a fourth transistor in series, for generating a second current in response to the output voltage. The circuit further includes a resistor coupled in parallel to the fourth transistor, an inverter coupled to a connection node between the third and fourth transistors, for inverting a voltage at the connection node and generating an inversion voltage, and a fifth transistor for controlling a switching element flowing a reference current proportional to the voltage with the negative temperature coefficient in response to the inversion voltage.

10 Claims, 7 Drawing Sheets

START-UP CIRCUIT FOR BANDGAP REFERENCE

CROSS-REFERENCE TO RELATED APPLICATIONS

This application claims the benefit of U.S. Provisional Application No. 62/191,235 filed Jul. 10, 2015, the entire contents of which are herein incorporated by reference.

BACKGROUND

1. Field

Exemplary embodiments of the present disclosure relate to a reference voltage generation device.

2. Description of the Related Art

A reference voltage is used in many parts of a system on a chip (SOC), such as temperature sensor, regulators, dynamic random access memories (DRAMs) and flash memory circuits. A common way to generate the reference voltage is to use a bandgap reference (BGR) which achieves stability over process, voltage, and temperature (PVT). The inclusion of diodes in a bandgap reference (BGR) circuit can be easily implemented by exploiting the parasitic vertical bipolar junction transistors (BJTs) used in standard complementary metal oxide semiconductor (CMOS) processes and thus, makes the BGR circuit a popular choice.

SUMMARY

Embodiments of the present disclosure are directed to a start-up circuit for bandgap reference and a reference voltage generation device including the start-up circuit.

Aspects of the invention may include a reference voltage generation device. The reference voltage generation device may include a bandgap reference circuit and a start-up circuit. The bandgap reference circuit may include: a first branch including a first transistor, a first resistor and a first diode in series, for generating a first current; a second branch including a second transistor and a second diode in series, for generating a second current; and an output circuit for generating a bandgap voltage based on the sum of the first and second currents. The start-up circuit may include: a replica diode for the second diode; an operational amplifier including a first input terminal coupled to the second diode, a second input terminal coupled to the replica diode, and an output terminal; a first current branch including a third transistor and a fourth transistor in series between a power supply terminal and a ground terminal, for generating a first current in response to an output voltage at the output terminal of the operational amplifier; a second current branch including a fifth transistor and a sixth transistor in series between the power supply terminal and the ground terminal, for generating a second current in response to the output voltage at the output terminal of the operational amplifier; a second resistor coupled in parallel to the sixth transistor, an inverter coupled to a connection node between the fifth transistor and the sixth transistor, for inverting a voltage at the connection node and generating an inversion voltage; and a seventh transistor suitable for controlling the second transistor in response to the inversion voltage.

Other aspects of the invention may include a start-up circuit for a bandgap reference circuit. The start-up circuit may include: an operational amplifier including a first input terminal for receiving a voltage with a negative temperature coefficient from the bandgap reference circuit, a second input terminal, and an output terminal; a diode coupled to the second input terminal of the operational amplifier; a first current branch including a first transistor and a second transistor in series between a power supply terminal and a ground terminal, for generating a first current in response to an output voltage at the output terminal of the operational amplifier; a second current branch including a third transistor and a fourth transistor in series between the power supply terminal and the ground terminal, for generating a second current in response to the output voltage at the output terminal of the operational amplifier; a resistor coupled in parallel to the fourth transistor; an inverter coupled to a connection node between the third transistor and the fourth transistor, for inverting a voltage at the connection node and generating an inversion voltage; and a fifth transistor for controlling a switching element flowing a reference current proportional to the voltage with the negative temperature coefficient in response to the inversion voltage.

DETAILED DESCRIPTION

Figure 1:
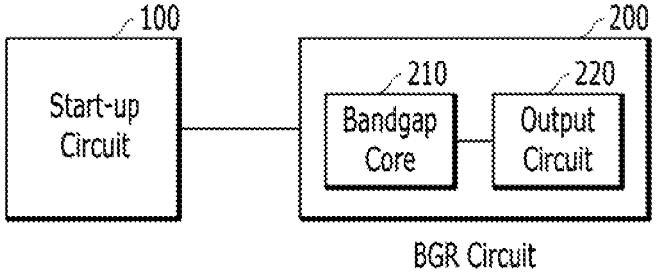
FIG. 1 is a block diagram illustrating a reference voltage generation device according to conventional techniques.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium, and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a genera component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity technical material that is known in the technical fields related to the invention has not been described in detail so that the invention is not unnecessarily obscured.

FIG. 1, is a block diagram illustrating a reference voltage generation device.

Referring to FIG. 1, the reference voltage generation device may include a bandgap reference (BGR) circuit 200. The BGR circuit 200 may include a complementary metal oxide semiconductor (CMOS) BGR circuit, which is simply composed of a CMOS operational amplifier, field-effect transistors (FETs), diodes and resistors. The BGR circuit 200 may operate with a low supply-voltage, for example, below 1V or sub-1V. That is, due to the increasing demand for low-power and low-voltage operations, the BGR circuit 200 may be utilized to operate under such low supply ranges. Typically, the BGR circuit 200 may generate a reference voltage and a reference current, and may include a bandgap (BG) core 210 and an output circuit 220.

This topology not only solves the issue of operating with low supply voltages, for example, voltages as low as ~0.85V, but also provides a relatively stable reference over process, voltage, and temperature (PVT) for other building blocks without using additional circuits such as, amplifiers. Therefore, this topology essentially addresses the requirement for low power and eliminates the additional cost, design and area required by using extra circuits.

However, since the BGR circuit 200 is self-biased, a start-up circuit 100 is required to wake up the BG core 2101 from the initial condition in which little or zero current flows in the BG core 210. It is also important to ensure that the startup circuit 100 does not affect normal operations, or consume too much current from a power supply in the normal mode.

Figure 2:
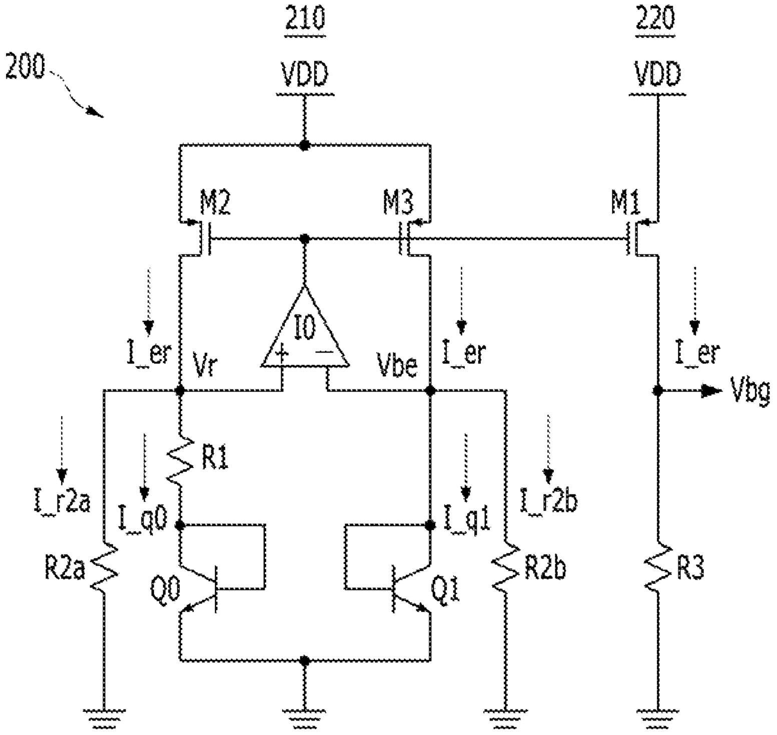
FIG. 2 is a circuit diagram illustrating a sub-1V bandgap reference circuit according to conventional techniques.

FIG. 2 is a circuit diagram illustrating a sub-1V bandgap reference (BGR) circuit 200. The construction of the BGR circuit 200 is proposed by Hironori Banba, et al., "A CMOS Bandgap Reference Circuit with Sub-1V Operation." IEEE Journal of Solid State Circuits, vol. 34, No. 5, (May 1999) pp. 670-674.

Referring to FIG. 2, the BGR circuit 200 includes the bandgap core 210 and the output circuit 220. The output circuit 220 includes a field effect transistor (FET) M1 and a resistor R3 coupled in series between a power supply terminal VDD and a ground terminal. The FET M1 includes a first terminal coupled to the power supply terminal VDD, and a third terminal coupled to an output terminal for outputting the bandgap reference voltage Vbg. The resistor R3 includes a first terminal coupled to the output terminal, and a second terminal coupled to the ground terminal. A reference (ER) current I_er flows through the resistor R3.

The bandgap core 210 includes an operational amplifier IO, FETs M2 and M3, bipolar junction transistors (BJTs) Q0 and Q1, resistors R1, R2*a* and R2*b*. First and second terminals of the transistors Q0 and Q1 are coupled to each other, and thus the transistors Q0 and Q1 function as diodes.

The FET M2, the resistor R1 and the diode Q0 in a first branch are coupled in series between the power supply terminal VDD and the ground terminal. The FET M3 and the diode Q1 its a second branch are coupled in series between the power supply terminal VDD and the ground terminal. First terminals of the FETs M2 and M3 are coupled to the power supply terminal VDD. Second terminals of the FETs M1, M2 and M3 are coupled to an output terminal of the operational amplifier IO. A third terminal of the FET M2 is coupled to one terminal of the resistor R1 and a first input terminal, that is, a non-inversion terminal (+) of the operational amplifier IO. The other terminal of the resistor R1 is coupled to the first and second terminals of the transistor Q0. A third terminal of the FET M3 is coupled to the first and second terminals of the transistor Q1 and a second input terminal, that is, an inversion terminal (−) of the operational amplifier IO. Third terminals of the transistors Q0 and Q1 are coupled to the ground terminal. One terminal of the resistor R2*a* is coupled to the first input terminal, that is, the non-inversion terminal (+) of the operational amplifier IO. The other terminal of the resistor R2*a* is coupled to the ground terminal. One terminal of the resistor R2*b* is coupled to the second input terminal, that is, the inversion terminal (−) of the operational amplifier IO. The other terminal of the resistor R2*b* is coupled to the ground terminal.

Currents I_er flow through the transistors M1, M2 and M3, respectively. A current I_q0 flows toward the diode Q0 and a current I_q1 flows toward the diode Q1. A current I_r2*a* flows toward the resistor R2*a* and a current I_r2*b* flows toward the resistor R2*b*. A voltage Vr is generated in the first input terminal of the operational amplifier IO, and a voltage Vbe is generated in the second input terminal of the operational amplifier IO. The bandgap voltage Vbg is generated in the third terminal of the transistor M1.

The bandgap voltage Vbg is converted from the sum of two currents: one is proportional to the voltage Vbe across the diode Q1, and the other is proportional to the thermal voltage Vt. The voltage Vbe has a negative temperature coefficient, for example mV/C, whereas the voltage Vt has a positive temperature coefficient, for example, 0.085 mV/C. By combining the two currents with a proper ratio, the ER current I_er that can then be converted to a constant voltage independent of the temperature, is generated. The ER current I_er is defined as:

$$I\_er = Vbg/R3 \tag{1}$$

The ER current I_er can then be converted to the reference voltage Vbg insensitive to PVT by a local resistor R3. Additionally, since the current reference is less sensitive to noise than the voltage reference is, the ER current I_er is a good candidate for long distance bias distribution.

The resistors R2*a* and R2*b* are placed in parallel with the diodes Q0 and Q1 respectively, such that ER current I_er can be directly generated from the BGR core 210 without extra follow-on stages. This simplifies the BGR design but introduces the startup issue: the BGR core 210 may not start or may settle to incorrect bias point due to infinite false steady states when diodes Q0 and/or Q1 are still off. Thus, it is required to design a start-up circuit to avoid the false steady state issue.

Figure 3:
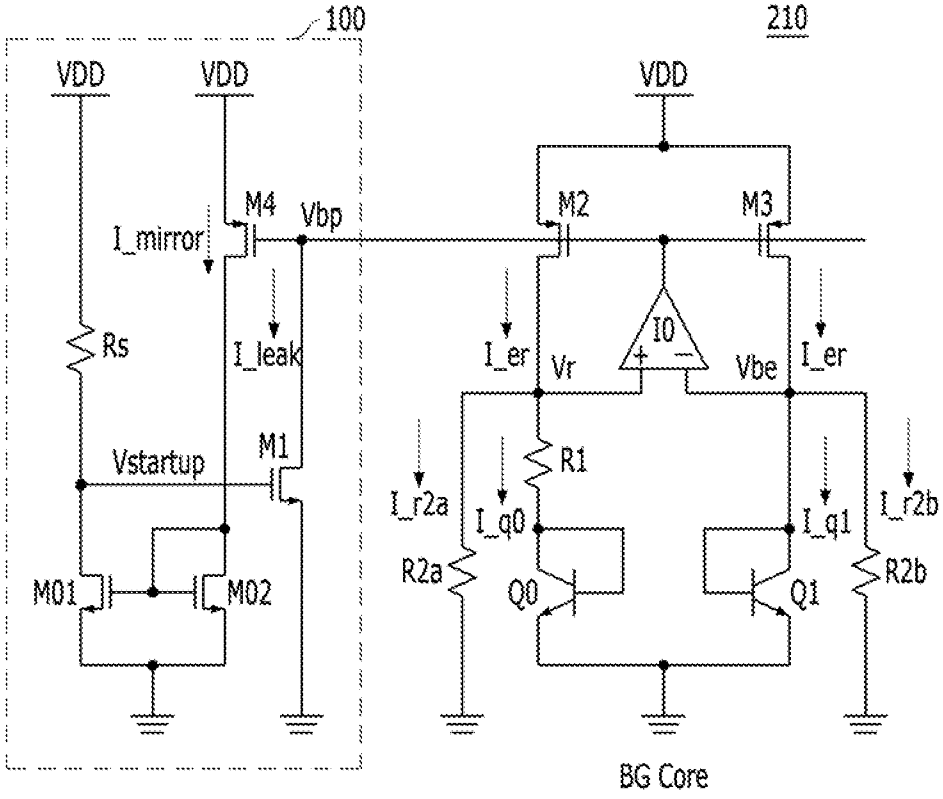
FIG. 3 is a circuit diagram illustrating a conventional start-up circuit for a sub-1V bandgap reference circuit according to conventional techniques.

FIG. 3 is a circuit diagram illustrating a conventional start-up circuit for a sub-1V bandgap reference circuit. For example, the start-up circuit of FIG. 3 may be the start-up circuit 100 for the bandgap (BG) core 210 of the sub-1V bandgap reference circuit 200 shown in FIG. 2.

Referring to FIG. 3, the start-up circuit 10 may include transistors M01, M02, M1 and M4, and a resistor Rs. The resistor Rs and the transistor M01 are coupled in series between the power supply terminal VDD and the ground terminal. The transistors M4 and M02 are coupled in series between the power supply terminal VDD and the ground terminal. One terminal of the resistor Rs is coupled to the power supply terminal VDD, and the other terminal of the resistor Rs is coupled to a first terminal of the transistor M01. A second terminal of the transistor M01 is coupled to a second terminal of the transistor M02. Third terminals of the transistors M01 and M02 are coupled to the ground terminal. The first and second terminals of the transistor M02 are coupled to a third terminal of the transistor M4.

The first terminal of the transistor M42 is coupled to the power supply terminal VDD. The second terminal of the transistor M4 is coupled to a first terminal of the transistor M1. Also, the second terminal of the transistor M4 is coupled to the second terminals of the transistors M2 and M3 in the bandgap core 210. The second terminal of the transistor M1 is coupled to the first terminal of the transistor M01. The third terminal of the transistor M1 is coupled to the ground terminal.

A current I_mirror flows through the transistor M4, and a current I_leak flows toward the transistor M1. A voltage Vstartup is generated in the second terminal of the transistor M1, and a voltage Vbp is generated in the second terminal of the transistor M4.

In FIG. 3, the start-up circuit 10 pulls down the voltage Vbp to ensure that a significant amount of the current I_er flows through the transistors M2 and M3 and builds up enough voltage across the diodes Q0 and Q1. Once the voltage Vbp is sufficient to trigger the operational amplifier I0, the operational amplifier 10 will take over to bias the BGR core 210 to its normal operating condition.

However, in the sub-1V BGR core 210, the additional paths through the two identical resistors, that is, R2*a* and R2*b*, allow more than one steady state of the bias points to exist. The false steady states exist when the voltage drop across the diodes Q0 and Q1 is less than the diode's turn-on voltage, for example, ~0.6V.

The operation of the start-up circuit 10 will be described in detail.

Initially, there is no current on any branch of current mirrors, including the transistors M2, M3, and M4. The voltage Vstartup in the meanwhile follows the voltage VDD since no current passes through the resistor Rs. The pull-down transistor M1 thus provides leakage current I_leak with its gate controlled by the voltage Vstartup. The current I_leak pulls the voltage Vbp down to a certain level, where the transistors M2, M3, and M4 of the bandgap core 210 are turned on and supply the current I_er to the bandgap core 210 and the current I_mirror to the start-up circuit 10. The current I_mirror is a fraction of the current I_er defined by the current mirror ratio α as the following:

$$I\_mirror=\alpha * I\_er \quad (2)$$

The voltage Vstartup thereafter becomes:

$$Vstartup=VDD-I\_mirror*Rs \quad (3)$$

When the current I_mirror is high enough, the voltage Vstartup will be pulled down to disable the tart-up circuit 10 and at this moment the operational amplifier IO of the bandgap core 210 will be in charge of the rest of the loop setting.

Figure 4:
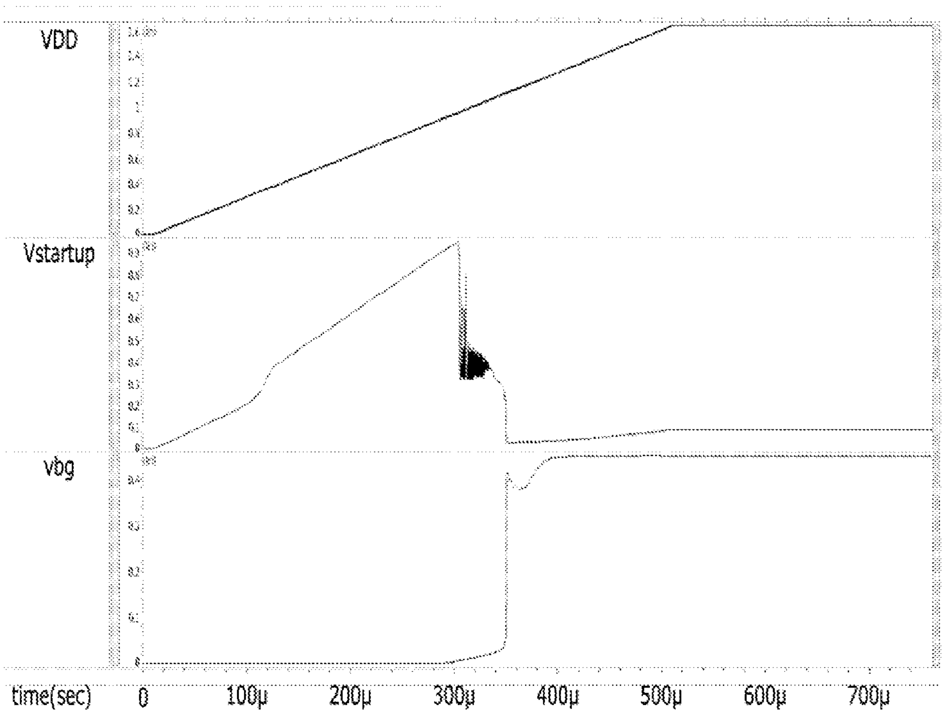
FIG. 4 illustrates an example of expected behavior of a start-up circuit according to conventional techniques.
Figure 5:
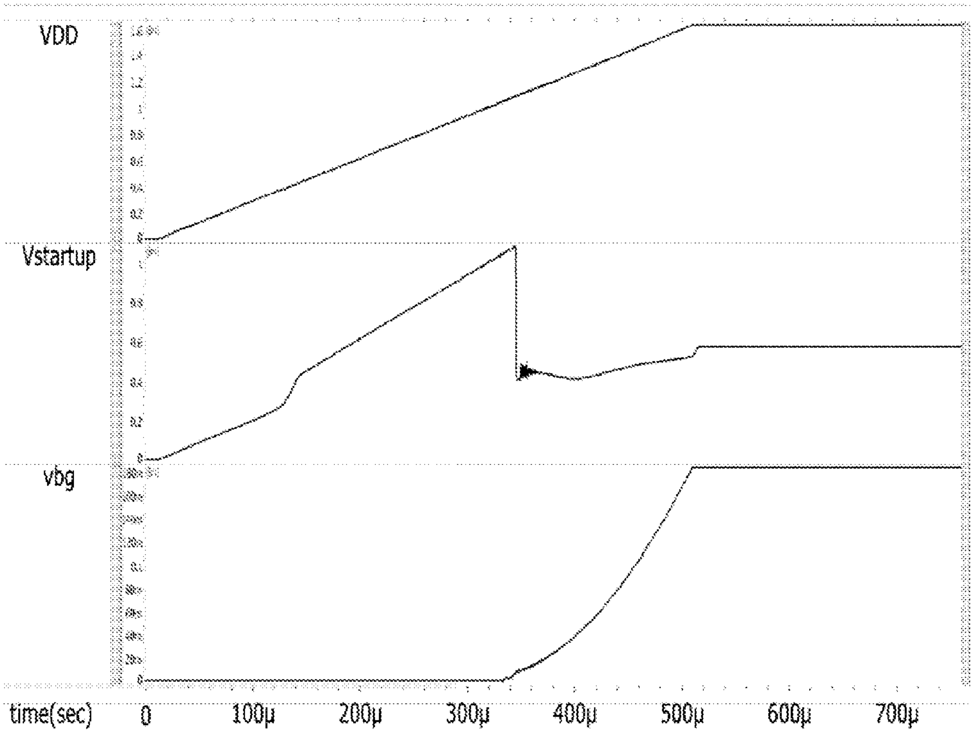
FIG. 5 illustrates that a start-up circuit according to conventional techniques can lead to a false steady state at some process, voltage, and temperature (PVT) corners.

However, in some PVT corners, the current I_mirror is high enough to disable the start-up circuit 10, but the current I_er is not high enough to turn on the diodes Q0 and Q1. In this case, in the bandgap core 210, the current I_er from the transistors M2 and M3 all flow to the resistors R2*a* and R2*b* with the same resistance R2, and the input voltages Vr and Vbe of the operational amplifier I0 are always equal, raking the feedback loop settle to a wrong or false steady state. The transient expected behaviors of the start-up circuit 10 is shown in FIG. 4. The start-up circuit 10 leads to the false steady state as shown in FIG. 5.

Even if the loop settles to the right bias point, the voltage Vstartup still needs to be low enough to ensure that the leakage current I_leak through the transistor M1 does not affect the normal operation of the BGR circuit 200.

To meet all requirement, the currents I_mirror and I_leak, the resistor Rs and the BGR core 210 have to be optimized to get the best trade-off between the DC variation and dynamic start-up behavior of the BGR core 210. However, the optimization is not easy over PVT, and the potential issue of uncertain start-up still exists.

To better understand the issue, presume that the BGR loop reaches the steady state when the two voltages Vr and Vbe are equal. Since the transistors M2 and M3 have the same size, the current through both transistors are I_er. By applying the Kirchhoff's Current Law (KCL) to both branches of the BGR core 210, the current through both the transistors M2 and M3 are:

$$I\_er=I\_q0+I\_r2a \quad (4)$$

$$I\_er=I\_q1+I\_r2b \quad (5)$$

Since the resistors R2*a*=R2*b*=R2 by design and the voltage Vr=Vbe by the feedback loop, the currents I_r2*a* and I_r2*b* are:

$$I\_r2a=I\_r2b=Vbe/R2 \quad (6)$$

From the physics of the diodes Q0 and Q1, when the voltages Vr=Vbe, the currents I_q0 and Iq1 are:

$$I\_q0=Iq1=Vt*In(N)/R1 \quad (7)$$

In the equation (7), N is the geometric ratio of the diode Q0 over Q1, Vt is the thermal voltage, and In(•) is the natural logarithm function.

From the equations (4), (5), (6) and (7), the ER current I_er can then be written as:

$$I\_er=(Vbe/R2)+[Vt*In(N)/R1] \quad (8)$$

In the equation (8), the ER current I_er contains both the current component (Vbe/R2) with a negative temperature coefficient, and the current component [Vt*In(N)/R1] with a positive temperature coefficient. With a proper choice of the resistors R1 and R2, the effects of the positive temperature coefficient and the negative temperature coefficient are canceled out, and the desired ER current with no dependence on the temperature can be generated.

However in the structure of the sub-1V BGR core 210, if the voltages Vbe and Vr are too low and the diodes Q0 and Q1 are still off, the feedback loop can still settle to a steady state in which Vr=Vbe. In this so-called false steady state, the ER current I_er becomes as:

$$I\_er=Vbe/R2 \tag{9}$$

In the equation (9), the ER current I_er contains only the current component with a negative temperature coefficient, and thus the ER current I_er is not a stable reference over the temperature.

In conclusion, when the diodes Q0 and Q1 are off, the resistors R2*a* and R2*b* still provide current paths to ground. Since the resistors R2*a* and R2*b* are identical the BGR loop can still settle to a steady state, that is, a false steady state, without the diodes Q0 and Q1 being turned on. However, in such case, the BGR current reference is not temperature independent.

Accordingly, embodiments to solve the issue above tweak the start-up circuit to guarantee that the initial current I_er is always high enough to turn on the diodes Q0 and Q1 while its leakage current once disabled, that is, in the BGR's normal mode is also low enough not to interface with the bandgap core 210 and causes extra Vbg variation.

Figure 6:
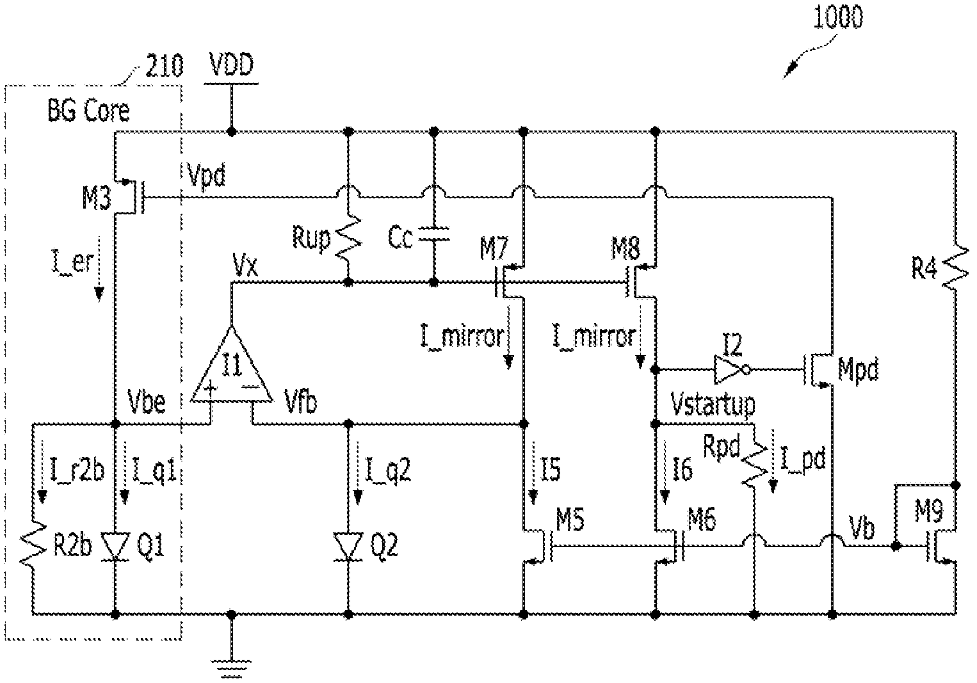
FIG. 6 is a circuit diagram illustrating a start-up circuit for a sub-1V bandgap reference circuit in accordance with an embodiment of the present invention.

FIG. 6 is a circuit diagram illustrating a start-up circuit 1000 for a sub-1V bandgap reference circuit in accordance with an embodiment of the present invention. For example, the start-up circuit 1000 is for start-up of a bandgap reference circuit, such as, a sub-1V bandgap reference circuit 210 shown in FIG. 1 to FIG. 30. For simplicity of illustration, it is noted that the bandgap core 210 of the sub-1V bandgap reference circuit 200 is partially shown.

Referring to FIG. 6, a half of the bandgap core 210 includes a transistor M3, a resistor R2*b* and a diode Q1. The start-up circuit 1000 may include an operational amplifier I1 an inverter I2 and a diode Q2. Also, the start-up circuit 1000 may include transistors M5 to M9 and Mpd. For example, the transistors M7 and M8 may be implemented with a P-MOS transistor, and the transistors M5, M6, M9 and Mpd may be implemented with an N-MOS transistor. Further, the start-up circuit 1000 may include resistors Rup, Rpd and R4, and a capacitor Cc.

As described above with reference to FIG. 2, the bandgap reference circuit may include a bandgap core 210 and an output circuit 220. The bandgap core 210 may include a first branch including a transistor M2, a resistor R1 and a diode Q0 in series, for generating a first reference current I_er, and a second branch including a transistor M3 and a diode Q1 in series, for generating a second reference current I_er. The output circuit 220 may generate a bandgap voltage Vbg based on the sum of the first and second reference currents.

The start-up circuit 1000 may include a replica diode Q2 for the diode Q1, and an operational amplifier I1 including a first input terminal coupled to the diode Q1, a second input terminal coupled to the replica diode Q2, and an output terminal. Also, the start-up circuit 1000 may include a first current branch including a transistor M7 and a transistor M5 in series between a power supply terminal and a ground terminal. The first current branch may generate a current I_mirror in response to an output voltage Vx at the output terminal of the operational amplifier I1. Further, the start-up circuit 1000 may include a second current branch including a transistor M8 and a sixth transistor M6 in series between the power supply terminal and the ground terminal. The second current branch may generate a current I_mirror in response to the output voltage Vx at the output terminal of the operational amplifier I1.

Further the start-up circuit 1000 may include a resistor Rpd coupled in parallel to the transistor M6, an inverter I2 coupled to a connection node between the transistor M8 and the transistor M6. The inverter I2 may invert a voltage Vstartup at the connection node and generate an inversion voltage. Further, the start-up circuit 1000 may include a transistor Mpd for controlling the transistor M3 of the bandgap core 210 in response to the inversion voltage. The transistor M3 is a switching element flowing a reference current I_er proportional to the voltage, that is, Vbe with the negative temperature coefficient.

The operational amplifier I1 includes a first input terminal, for example, an inversion (−) terminal, a second input terminal, for example, a non-inversion (+) terminal, and an output terminal. The diode Q2 is coupled between the second input terminal of the operational amplifier I1 and a ground terminal. Voltages Vbe and Vfb represent voltages at: the first input terminal and the second input terminal of the operational amplifier I1, respectively. A voltage Vx represents a voltage at the output terminal of the operational amplifier I1. A current I_q2 represents a current flow through the diode Q2.

The transistors M7 and M5 are coupled in series between a power supply terminal VDD and the ground terminal. The transistors M8 and M6 are coupled in series between the power supply terminal VDD and the ground terminal. First terminals of the transistors M7 and M8 are coupled to the power supply terminal VDD. Second terminals of the transistors M7 and M8 are coupled to the output terminal of the operational amplifier I1. Third terminals of the transistors M7 and M8 are coupled to first terminals of the transistors M5 and M6, respectively. Second terminals of the transistors M5 and M6 are coupled to a second terminal of the transistor M9. Third terminals of the transistors M5 and M6 are coupled to the ground terminal. Currents I_mirror represent a current flow through the transistors M7 and M8. A current I5 represents a current flow through the transistor M5, and a current I6 represents a current flow through the transistor M6.

The resistor R4 and the transistor M9 are coupled in series between the power supply terminal VDD and the ground terminal. A first terminal of the resistor R4 is coupled to the power supply terminal VDD. The first and second terminals of the transistor M9 are coupled to a second terminal of the resistor R4. A third terminal of the transistor M9 are coupled to the ground terminal. A voltage Vb represents a voltage at the first and second terminals of the transistor M9.

The resistor Rpd is coupled in parallel to the transistor M6. A first terminal of the resistor Rpd is coupled to the first terminal of the transistor M6, and a second terminal of the resistor Rpd is coupled to the ground terminal. A voltage Vpd represents a voltage at the first terminal of the transistor Mpd. A current Ipd represents a current flow through the resistor Rpd.

A first terminal of the resistor Rup is coupled to the power supply terminal VDD, and a second terminal of the resistor Rup is coupled to the output terminal of the operational amplifier I1 and the second terminal of the transistors M7 and M8. A first terminal of the capacitor Cc is coupled to the power supply terminal VDD, and a second terminal of the capacitor Cc is coupled to the output terminal of the operational amplifier I1 and the second terminal of the transistors M7 and M8.

A first terminal of the transistor Mpd is coupled to the second terminal of the transistor M3 included in the bandgap core 210. The second terminal of the transistor Mpd is coupled to the output terminal of the inverter I2. A third terminal of the transistor Mpd is coupled to the ground terminal. An input terminal of the inverter I2 is coupled to the third terminal of the transistor M8 and the first terminal of the transistor M. An output terminal of the inverter I2 is coupled to a second terminal of the transistor Mpd.

Figure 7:
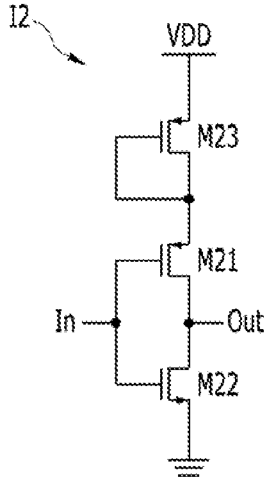
FIG. 7 is a circuit diagram illustrating an inverter in accordance with an embodiment of the present invention.

FIG. 7 is a circuit diagram illustrating an inverter in accordance with an embodiment of the present invention. For example, the inverter of FIG. 7 may be the inverter I2 shown in FIG. 6.

Referring to FIG. 7, the inverter may be a skew inverter including transistors M21, M22 and M23 coupled between a power supply terminal VDD and a ground terminal. The transistors M21 and M22 may be PMOS and NMOS transistors, respectively. Second terminals of the transistors M21 and M22 are coupled to an input terminal of the inverter. A third terminal of the transistor M21 and a first terminal of the transistor M22 are coupled to an output terminal of the inverter. A third terminal of the transistor is coupled to the ground terminal. The transistor M23 is a diode-coupled transistor, which is coupled between the power supply terminal VDD and a first terminal of the transistor M21. A first terminal of the transistor M23 is coupled to the power supply terminal VDD. Second and third terminals of the transistor M23 is coupled to the first terminal of the transistor M21.

Figure 8A:
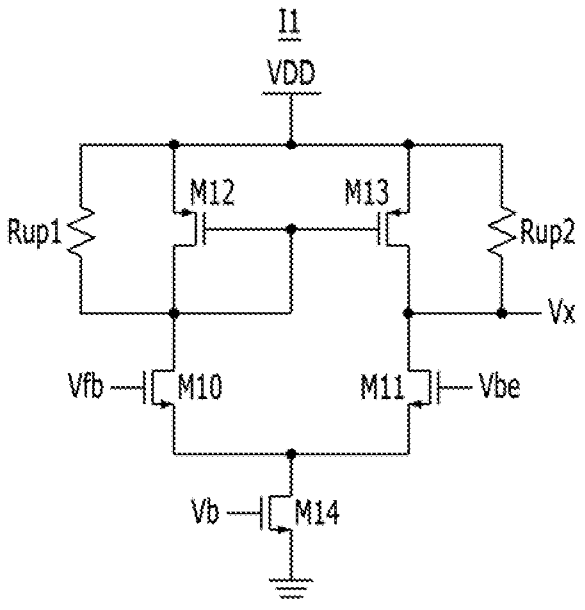
FIG. 8A is a circuit diagram illustrating an operational amplifier in accordance with an embodiment of the present invention.

FIGS. 8A and 88 are circuit diagrams illustrating an operational amplifier in accordance with embodiments of the present invention. The operational amplifier of FIG. 8A corresponds to the operational amplifier I1 of FIG. 6 with weak pull-up resistors Rup1 and Rup2. The weak pull-up resistors Rup1 and Rup2 correspond to the resistor Rup of FIG. 6. The operational amplifier of FIG. 8B corresponds to the operational amplifier I1 of FIG. 6 with weak pull-up current sources M17 and M18. The weak pull-up current sources M17 and M18 are biased by additional transistors M15 and M16.

Referring to FIG. 8A the operational amplifier I1 may include transistors M10, M11, M12, M13 and M14. The transistors M12 and M13 may be a PMOS transistor, and the transistors M10, M11 and M14 may be a NMOS transistor. First terminal of the transistors M12 and M13 are coupled to the power supply terminal VDD. A second terminal of the transistor M12 is coupled to a second terminal of the transistor M13 and a third terminal of the transistor M12. A first terminal of the transistor M10 is coupled to the third terminal of the transistor M12. Vfb represents a voltage at the second terminal of the transistor M10. A first terminal of the transistor M11 is coupled to the third terminal of the transistor M13. Vbe represents a voltage at the second terminal of the transistor M11. Third terminals of the transistors M10 and M11 are coupled to a first terminal of the transistor M14. Vb represents a voltage at a second terminal of the transistor M14. A third terminal of the transistor M14 is coupled to a ground terminal. Vfb and Vbe are the input voltages of the operational amplifier I1, and Vb is a bias voltage generated by the bias generator, that is, the resistor R4 and the diode-connected transistor M9 in FIG. 6.

Pull-up resistors Rup1 and Rup2 are coupled to loads of the operational amplifier I1. That is, the pull-up resistor Rup1 is coupled in parallel to the transistor M12 of the operational amplifier I1, and the pull-up resistor Rup2 is coupled in parallel to the transistor M13 of the operational amplifier I1. Vx represents a voltage at the third terminal of the transistor M13 and the first terminal of the transistor M11. Vx is the output voltage of the operational amplifier I1.

Figure 8B:
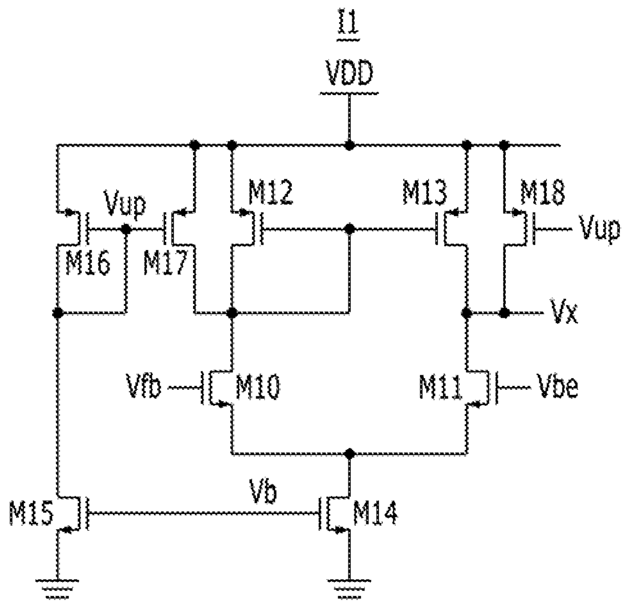
FIG. 8B is a circuit diagram illustrating an operational amplifier in accordance with another embodiment of the present invention.

Referring to FIG. 8B, the operational amplifier I1 may include transistors M10, M11, M12, M13 and M14. The transistors M12 and M13 may be a PMOS transistor, and the transistors M10, M11 and M14 may be a NMOS transistor. First terminals of the transistors M12 and M13 are coupled to the power supply terminal VDD. A second terminal of the transistor M12 is coupled to a second terminal of the transistor M13 and a third terminal of the transistor M12. A first terminal of the transistor M10 is coupled to the third terminal of the transistor M12. Vfb represents a voltage at the second terminal of the transistor M10. A first terminal of the transistor M11 is coupled to the third terminal of the transistor M13. Vbe represents a voltage at the second terminal of the transistor M11. Third terminals of the transistors M10 and M11 are coupled to a first terminal of the transistor M14. Vb represents a voltage at a second terminal of the transistor M14, A third terminal of the transistor M14 is coupled to a ground terminal. Vfb and Vbe are the input voltages of the operational amplifier I1, and Vb is a bias voltage generated by the bias generator, that is, the resistor R4 and the diode-connected transistor M9 in FIG. 6.

Transistors as current sources M17 and M18 are coupled to loads of the operational amplifier I1. The transistor M17 is coupled in parallel to the transistor M12 of the operational amplifier I1. A first terminal of the transistor M17 is coupled to the first terminal of the transistor M12, and a third terminal of the transistor M17 is coupled to the third terminal of the transistor M12. The transistors M16 and M15 are coupled in series between the power supply terminal and the ground terminal. A first terminal of the transistor M16 is coupled to the first terminal of the transistor M17. A second terminal of the transistor M16 is coupled to the second terminal of the transistor M17 and a third terminal of the transistor M16. The third terminal of the transistor M16 is coupled to a first terminal of the transistor M15. A second terminal of the transistor M15 is coupled to the second terminal of the transistor M14. A third terminal of the transistor M15 is coupled to the ground terminal.

The transistor M18 is coupled in parallel to the transistor M13 of the operational amplifier I1. A first terminal of the transistor M18 is coupled to the first terminal of the transistor M13, a third terminal of the transistor M18 is coupled to the third terminal of the transistor M13. Vx represents a voltage at the third terminals of the transistors M13 and M18, and the first terminal of the transistor M11. Vx is the output voltage of the operational amplifier I1. Vup represents a voltage at the second terminals of the transistors M16, M17, and M18 and represents the internal voltage of the operational amplifier I1.

Referring again to FIG. 6 the diode Q2 is a replica of Q1. The operational amplifier I1 is used to equalize the voltages Vbe and Vfb, and thus to make the currents I_q1 and I_q2 equal. The NMOS transistors M5 and M6 represent two identical current sources. The NMOS transistors M5 and M6 are biased by the voltage Vb, which can be generated by the resistor R4 in series with the NMOS transistor M9, The exact value of the currents I5 and I6 is not critical as long as I5=I6. The purpose of the transistor M5 as the current source is to provide the base current I5 to the PMOS transistor M7 such that the feedback loop formed by the operational amplifier I1 and the PMOS transistor M7 is never broken even if the diode current I_q2 is zero. A compensation capacitor Cc is added to improve the stability of the feedback loop.

The two PMOS transistors M7 and MB are identical and have the same current I_mirror. For the Kirchhoff's Current Law (KCL):

$$I\_mirror=I\_q2+I5=I\_pd+I6 \quad (10)$$

Since I5=I6 in the equation (10)

$$I\_pd=I\_q2 \quad (11)$$

Since the diode Q2 is a replica of the diode Q1, I_q1=I_q2 and thus $$I\_pd=I\_q1 \quad (12)$$

Therefore, the current of the diode Q1 is successfully copied to the resistor R_pd, and builds up a voltage drop Vstartup across the resistor R_pd, where $$Vstartup=I\_pd*R\_pd=I\_q1*R\_pd \quad (13)$$

In some embodiments, the current I_q1 of the diode Q1 is the indicator which determines if all the false steady states have been surpassed such that the start-up circuit 1000 can be safely disabled to let the bandgap core 210 take over the remainder of the loop settling.

When the diode Q1 is off, Iq1=0, and Vstartup=0. In this case, the output of the inverter I2 is a logic one. Thus, the NMOS transistor Mpd is turned on to pull down the voltage Vpd and keep the start-up process going on When there is enough current entering the diode Q1 (Iq1>0), Vstartup is higher than the trip point Vm of the inverter I2, and the output of the inverter I2 is flipped to a logic zero. Thus, the NMOS transistor Mpd is completely turned off. The criteria disable the NMOS transistor Mpd is determined by the equation (14).

$$Vstartup=I\_q1*R\_pd>Vm \quad (14)$$

For sizing concern, instead of increasing Rpd, reducing the inverter's trip point voltage Vm is more efficient. This may be achieved, as shown in FIG. 7, by skewing the PMOS/NMOS ratio, that is, M21/M22, and even adding a diode-coupled transistor M23 to further weaken the pull-up strength. In some, embodiments, the optimal inverter's trip point voltage Vm may be approximately 0.3V.

Regarding the operational amplifier I1, at the beginning of the start-up process, input voltages Vbe and Vfb could be lower than the operating range of the operational amplifier I1, and thus the output voltage Vx may be uncertain. If the output voltage Vx is unfortunately too low such that the transistors M7 and MB drain too much current, the voltage Vstartup could be too high and disable the transistor Mpd, and therefore the start-up circuit 1000 never has a chance to start the bandgap core 210. To avoid this scenario, the pull-up resistor Rup may be added, forcing the output voltage Vx toward VDD whenever the input voltages Vbe and Vfb are lower than the operating range of the operational amplifier I1. Alternatively, instead of the pull-up resistor Rup, a transistor as a current source may be added.

To further remove the systematic offset caused by the pull-up resistor Rup, instead of one pull-up resistor Rup, two resistors Rup1 and Rup2 as shown in FIG. 8A may be added to both sides of the operational amplifier I1's load. Alternatively, instead of the pull-up resistors Rup1 and Rup2, the transistors as two current sources M17 and M18 as shown in FIG. 8B may be added to both sides of the operational amplifier I1's load. Once the mechanism of the start-up circuit 1000 lifts up the input voltage Vbe to the operating range of the operational amplifier, the operational amplifier's stronger driving ability will override the weak pull-up resistors or transistors and continue the desired start-up process as mentioned above.

Compared to the start-up circuit 100 in FIG. 3, in the start-up circuit 1000 in FIG. 6, Vstartup now is gated by the inverter I2 and produces a solid 0V at the gate of the pull-down device Mpd when the startup process ends. Since Mpd is completely off, the leakage through Mpd is minimized and has the least influence on the bandgap core during the normal operation. This benefits BGR's variation over PVT.

Figure 9:
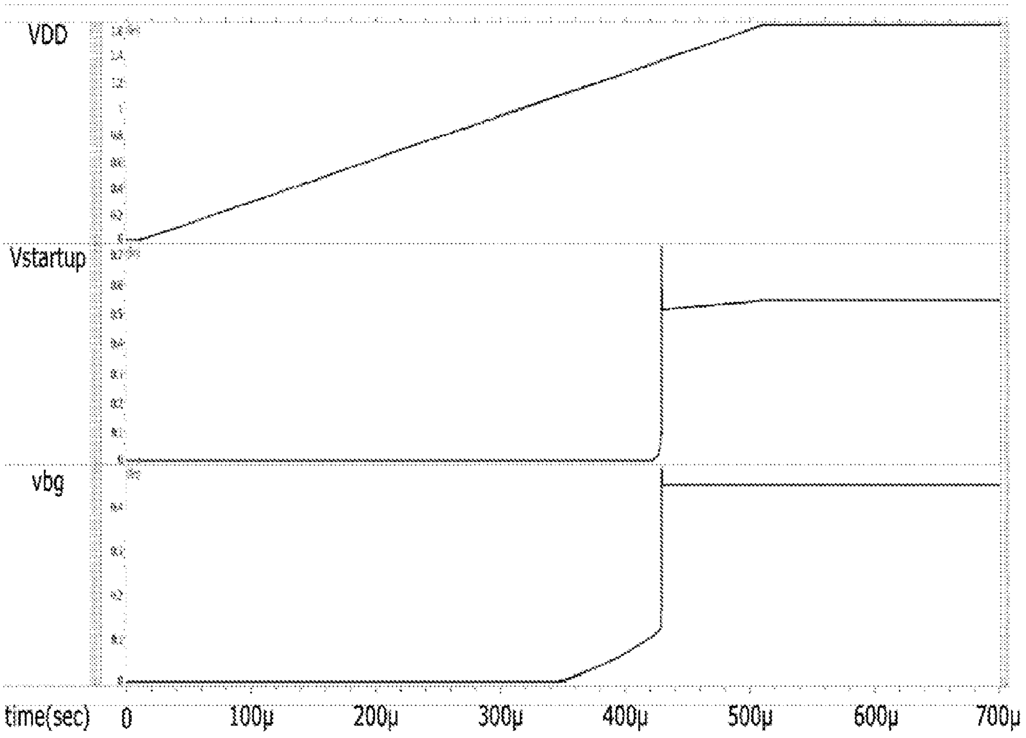
FIG. 9 illustrates an example of expected behavior of a start-up circuit in accordance with embodiments of the present invention.

FIG. 9 illustrates the transient behavior of the start-up circuit 1000 of FIG. 6 in accordance with the embodiments of the present invention.

Referring to FIG. 9, after the bandgap core 210 is ready, that is, approximately after 430 us, the voltage Vstartup is greater than the trip point Vm of the inverter I2, completely turning off the leakage path through the transistor Mpd. Compared with FIG. 4 which shows a strong fighting, that is, Vstartup waveform at 300 to 340 us, between the start-up circuit 10 and the bandgap core 210 in FIG. 3, the transient start-up behavior using the start-up circuit 1000 in FIG. 6 is smooth and clean as shown in FIG. 9. That reaffirms the robustness of the start-up circuit 1000. Vbg starts and settles down within 10 us, that is, approximately at 430 us with fast VDD supply ramping up.

Figure 10:
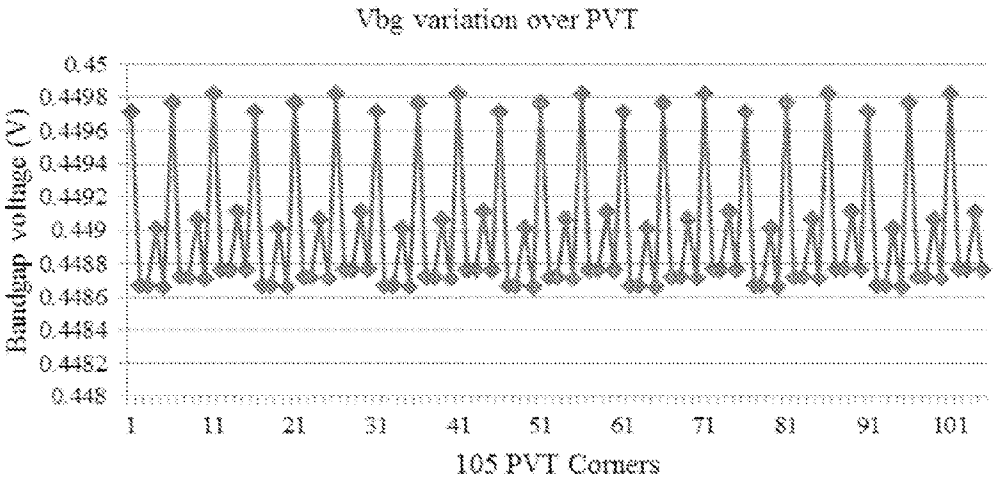
FIG. 10 illustrates bandgap voltage variation in accordance with embodiments of the present invention.

FIG. 10 illustrates the bandgap voltage (Vbg) variation over 105 PVT corners when the start-up circuit 1000 as shown in FIG. 6 is equipped.

Referring to FIG. 10, in accordance with the simulations for the start-up circuit 1000, the maximum variation is 1.3 mV, that is, 0.4499V-0.4486V, which is 25% less than the peak variation of the start-up circuit 10 in FIG. 3. The total power consumption of the start-up circuit 1000 is 45 uA, 30% of entire BGR circuit.

As described above, the start-up circuit 1000 makes the bandgap's startup process more robust over PVT variations. The BGR circuit does not fall into the false steady state with the start-up circuit 1000. The reduced leakage in the normal mode due to the start-up circuit 1000 also decreases Vbg variation. The leakage current after the BGR circuit starts is less than 400 pA and the bandgap voltage (Vbg) variation is about 1.5 mV over PVT.

Although the foregoing embodiments have been described it some detail for purposes of clarity of understanding, the invention is not limited to the details provided. There are many alternative ways of implementing the invention. The disclosed embodiments are illustrative and not restrictive.

What is claimed is:

1. A reference voltage generation device comprising:

a bandgap reference circuit having a first branch including a first transistor, a first resistor and a first diode in series, suitable for generating a first current, a second branch including a second transistor and a second diode in series, suitable for generating a second current, and an output circuit suitable for generating a bandgap voltage based on the sum of the first and second currents; and a start-up circuit suitable for starting-up the bandgap reference circuit, wherein the start-up circuit includes:

a replica diode for the second diode;

an operational amplifier including a first input terminal coupled to the second diode, a second input terminal coupled to the replica diode, and an output terminal;

a first current branch including a third transistor and a fourth transistor in series between a power supply terminal and a ground terminal, suitable for generating a first current in response to an output voltage at the output terminal of the operational amplifier;

a second current branch including a fifth transistor and a sixth transistor in series between the power supply terminal and the ground terminal, suitable for generating a second current in response to the output voltage at the output terminal of the operational amplifier;

a second resistor coupled in parallel to the sixth transistor;

an inverter coupled to a connection node between the fifth transistor and the sixth transistor, suitable for inverting a voltage at the connection node and generating an inversion voltage; and a seventh transistor suitable for controlling the second transistor in response to the inversion voltage.

2. The reference voltage generation device of claim 1, further comprising: a pull-up device suitable for pulling up the output voltage towards a power supply voltage.

3. The reference voltage generation device of claim 2, wherein the pull-up device includes at least one pull-up resistor coupled between the power supply terminal and the output terminal of the operational amplifier.

4. The reference voltage generation device of claim 2, wherein the pull-up device includes at least one current source coupled between the power supply terminal and the output terminal of the operational amplifier.

5. The reference voltage generation device of claim 1, further comprising: a capacitor coupled between the power supply terminal and the ground terminal.

6. The reference voltage generation device of claim 1, further comprising:

a bias generator suitable for generating a bias voltage and providing the fourth and sixth transistors with the bias voltage.

7. The reference voltage generation device of claim 6, wherein the bias generator includes:

a third resistor; and a diode-connected transistor in series between the power supply terminal and the ground terminal, the diode-connected transistor suitable for generating the bias voltage.

8. The reference voltage generation device of claim 1, wherein the inverter includes a skew inverter coupled between the power supply terminal and the ground terminal, suitable for receiving a voltage at the connection node, inverting the voltage at the connection node and generating the inversion voltage to the seventh transistor.

9. The reference voltage generation device of claim 8, wherein the inverter includes:

an eighth transistor including a first terminal coupled to the power supply terminal, a second terminal for receiving the voltage at the connection node, and a third terminal coupled to the seventh transistor, for generating the inversion voltage; and a ninth transistor including a first terminal coupled to the seventh transistor, for generating the inversion voltage, a second terminal for receiving the voltage at the connection node, and a third terminal coupled to the ground terminal.

10. The reference voltage generation device of claim 8, wherein the inverter further includes a diode-connected transistor coupled between the power supply terminal and the skew inverter.

* * * * *